(12) United States Patent
Yao et al.

(10) Patent No.: US 10,643,784 B2
(45) Date of Patent: May 5, 2020

(54) FILTER INDUCTOR FOR HEAVY-CURRENT APPLICATION

(71) Applicant: Bel Fuse (MACAO COMMERCIAL OFFSHORE) Limited, Andar H-K (MO)

(72) Inventors: Jianbin Yao, Zhejiang (CN); Hai Huang, Zhejiang (CN)

(73) Assignee: Bel Fuse (Macao Commercial Offshore) Limited (MO)

( * ) Notice: Subject to any disclaimer, the term of this patent is extended or adjusted under 35 U.S.C. 154(b) by 254 days.

(21) Appl. No.: 15/491,055

(22) Filed: Apr. 19, 2017

(65) Prior Publication Data

US 2017/0309390 A1 Oct. 26, 2017

Related U.S. Application Data

(60) Provisional application No. 62/325,258, filed on Apr. 20, 2016.

(51) Int. Cl.
| | |
|---|---|
| *H01F 27/29* | (2006.01) |
| *H01F 27/28* | (2006.01) |
| *H01F 27/24* | (2006.01) |
| *H01F 41/10* | (2006.01) |
| *H01F 41/02* | (2006.01) |
| *H05K 1/18* | (2006.01) |

(Continued)

(52) U.S. Cl.
CPC ......... *H01F 27/2852* (2013.01); *H01F 17/04* (2013.01); *H01F 17/043* (2013.01); *H01F 27/24* (2013.01); *H01F 27/292* (2013.01); *H01F 27/306* (2013.01); *H01F 41/0206* (2013.01); *H01F 41/10* (2013.01); *H05K 1/0263* (2013.01); *H05K 1/184* (2013.01); *H01F 2027/297* (2013.01); *H05K 2201/086* (2013.01); *H05K 2201/1003* (2013.01)

(58) Field of Classification Search
CPC .......................................................... H01F 3/10
USPC ........................................................ 336/192
See application file for complete search history.

(56) References Cited

U.S. PATENT DOCUMENTS

| | | | | |
|---|---|---|---|---|
| 5,565,837 A | * | 10/1996 | Godek | ................ H01F 17/0006 174/250 |
| 6,114,932 A | * | 9/2000 | Wester | ................ H01F 17/0006 336/192 |

(Continued)

*Primary Examiner* — Alexander Talpalatski
*Assistant Examiner* — Joselito Baisa
(74) *Attorney, Agent, or Firm* — BainwoodHuang

(57) ABSTRACT

A filter inductor for high-current applications. The filter inductor includes a magnetic core and a winding. The winding includes a shaped section having opposing ends, a pair of arm sections laterally extending from the opposing ends of the shaped section, respectively, and a pair of inductor pins, each extending perpendicular from an end of a respective arm section. The magnetic core includes a first core portion and a second core portion. The first core portion includes a recessed channel configured to receive the shaped section of the winding. The second core portion includes a pair of recessed regions configured to receive the pair of arm sections of the winding, respectively. The first core portion and the second core portion are coupled in contact to one another to secure the shaped section of the winding within the magnetic core. The filter inductor can be edge-mounted to a printed circuit board.

18 Claims, 4 Drawing Sheets

(51) Int. Cl.
*H05K 1/02* (2006.01)
*H01F 17/04* (2006.01)
*H01F 27/30* (2006.01)

(56) References Cited

U.S. PATENT DOCUMENTS

| | | | | |
|---|---|---|---|---|
| 6,320,748 | B1* | 11/2001 | Roden | H01F 23/367 |
| | | | | 165/185 |
| 7,009,484 | B2* | 3/2006 | Gray | H01F 17/043 |
| | | | | 336/192 |
| 7,259,648 | B2* | 8/2007 | Matsutani | H01F 27/027 |
| | | | | 336/200 |
| 7,280,025 | B2* | 10/2007 | Sano | H01F 17/06 |
| | | | | 336/200 |
| 8,294,544 | B2* | 10/2012 | Ikriannikov | H01F 3/14 |
| | | | | 336/178 |
| 9,691,538 | B1* | 6/2017 | Ikriannikov | H01F 3/10 |
| 2007/0176726 | A1* | 8/2007 | Xu | H01F 37/00 |
| | | | | 336/229 |
| 2009/0071683 | A1* | 3/2009 | Yasuda | H05K 1/0263 |
| | | | | 174/68.2 |
| 2010/0007453 | A1* | 1/2010 | Yan | H01F 27/027 |
| | | | | 336/90 |
| 2010/0013587 | A1* | 1/2010 | Yan | H01F 17/04 |
| | | | | 336/192 |
| 2012/0169449 | A1* | 7/2012 | Wu | H01F 17/043 |
| | | | | 336/221 |
| 2014/0002227 | A1* | 1/2014 | Hsieh | H01F 27/022 |
| | | | | 336/200 |

\* cited by examiner

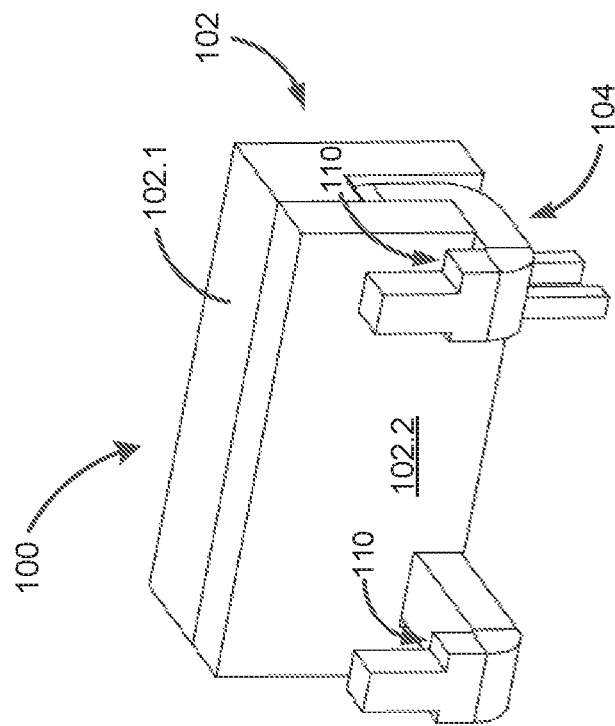
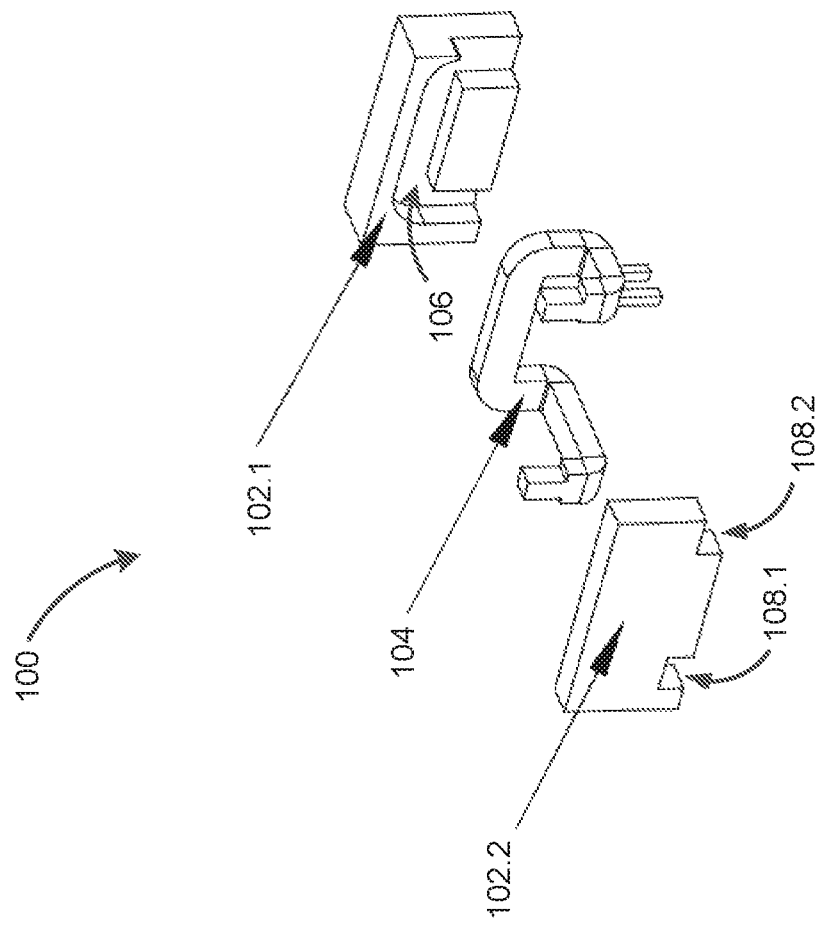

FILTER INDUCTOR FOR HEAVY-CURRENT APPLICATION

CROSS-REFERENCE TO RELATED APPLICATIONS

This application claims benefit of the priority of U.S. Provisional Patent Application No. 62/325,258 filed Apr. 20, 2016 entitled FILTER INDUCTOR FOR HEAVY-CURRENT APPLICATION.

BACKGROUND

The present application relates generally to passive magnetic components for high-current applications, and more specifically to filter inductors for high-current applications such as power supply modules that need to satisfy requirements of compactness, high efficiency, high power density, ease of manufacture, and reduced cost.

Power supply modules such as direct current (DC)-to-DC power supply modules and others generally employ one or more filter inductors. A conventional filter inductor typically includes a magnetic core, and a coil of conductive wire wrapped around the magnetic core. Employing a magnetic core with a high permeability, as well as increasing the number of turns of the coil of conductive wire around the magnetic core, can increase an inductance of the filter inductor. Such a filter inductor can be employed in a DC-to-DC power supply module, possibly in conjunction with a filter capacitor, for removing fluctuations such as residual hums (e.g., mains hums) from a DC output.

SUMMARY

In accordance with the present application, filter inductors for high-current applications are disclosed that can avoid at least some of the drawbacks of conventional high current filter inductors, which are typically configured as large, fixed format, high profile components. Ongoing advancements in electronic packaging have called for the use of electrical and electronic circuits, components, and/or printed circuit board (PCB) assemblies that have a decreased size and weight and/or a lower profile, such as integrated circuit (IC) components and PCB assemblies employing surface mount techniques. However, the size, weight, and/or profile of passive magnetic components such as filter inductors have generally not decreased to the extent desired and/or required by the electronic packaging industry.

The disclosed filter inductors for high-current applications can avoid at least some of the drawbacks of conventional high current filter inductors by employing a compact winding-magnetic core configuration that allows a filter inductor to be mounted along an edge of a PCB, thereby lowering the profile of the filter inductor in a completed PCB assembly. The profile of the filter inductor can be further lowered by reducing a height of the magnetic core. Moreover, the winding and one or more connector pins of the filter inductor can be formed as an integrated structure, thereby decreasing the overall size of the filter inductor, as well as shortening an associated current path, reducing a power consumption of the filter inductor, and improving a thermal resistance between the filter inductor and one or more external components, devices, and/or equipment items.

In one aspect, a filter inductor for high-current applications includes a magnetic core assembly and a winding. The winding includes a shaped winding section (e.g., a C-shaped section) having opposing ends, a pair of arm sections laterally extending from the opposing ends of the C-shaped section, respectively, and a pair of inductor pins, each inductor pin extending substantially perpendicular from an end of a respective one of the pair of arm sections. The winding can further include one or more connector pins extending substantially perpendicular from at least one of the arm sections, in a direction opposite to that of the inductor pin extending from the respective arm section. The magnetic core assembly includes a first core portion and a second core portion. The first core portion includes a recessed channel configured to receive the C-shaped section of the winding. The second core portion includes a pair of recessed regions configured to receive the pair of arm sections of the winding, respectively.

In one mode of fabrication, the winding including the C-shaped section, the pair of arm sections, the pair of inductor pins, and the connector pins are formed from a sheet of copper material using any suitable sheet-metal processing technique. Further, the recessed channel is formed in the first core portion, and the recessed regions are formed in the second core portion. The C-shaped section of the winding is received in the recessed channel of the first core portion, and the arm sections of the winding are received in the recessed regions of the second core portion, respectively. The first core portion and the second core portion are coupled in contact to one another to secure at least the C-shaped section of the winding within the magnetic core assembly.

By providing a filter inductor that includes at least a winding having a shaped winding section, a pair of arm sections laterally extending from opposing ends of the shaped winding section, respectively, and a pair of inductor pins, in which each inductor pin extends substantially perpendicular from an end of a respective one of the pair of arm sections, the filter inductor can be mounted along an edge of a PCB, thereby lowering the profile of the filter inductor in a completed PCB assembly. Moreover, by forming the winding and at least one connector pin as an integrated structure, in which the connector pin extends substantially perpendicular from one of the arm sections in a direction opposite to that of the inductor pin extending from the respective arm section, the overall size of the filter inductor can be decreased, while shortening an associated current path, reducing a power consumption of the filter inductor, and improving a thermal resistance between the filter inductor and one or more external components, devices, and/or equipment items.

Other features, functions, and aspects of the invention will be evident from the Detailed Description that follows.

BRIEF DESCRIPTION OF THE DRAWINGS

The foregoing and other aspects, features, and advantages will be apparent from the following description of particular embodiments of the invention, as illustrated in the accompanying drawings in which like reference numerals and characters refer to the same parts throughout the different views.

FIG. 1a is an exploded view of an exemplary filter inductor, in accordance with the present application;

FIG. 1b is a perspective view of the filter inductor of FIG. 1a, in which the filter inductor is illustrated in an assembled configuration;

DETAILED DESCRIPTION

Figure 2:
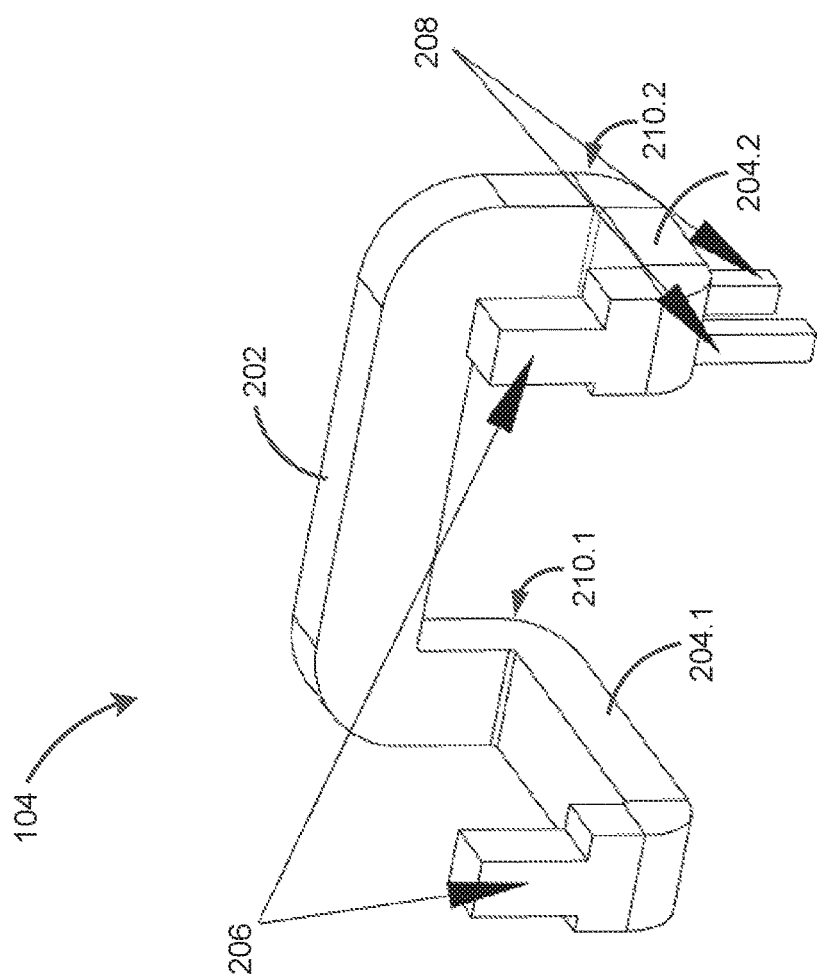
FIG. 2 is a perspective view of an exemplary winding included in the filter inductor of FIGS. 1a and 1b.

The disclosure of U.S. Provisional Patent Application No. 62/325,258 filed Apr. 20, 2016 entitled FILTER INDUCTOR FOR HEAVY-CURRENT APPLICATION is hereby incorporated herein by reference in its entirety.

Filter inductors for high-current applications are disclosed that employ a compact winding-magnetic core configuration that allows a filter inductor to be mounted along an edge of a printed circuit board (PCB), thereby lowering the profile of the filter inductor in a completed PCB assembly. The filter inductor can include a winding and one or more connector pins formed as an integrated structure, which can decrease the overall size of the filter inductor, as well as shorten an associated current path, reduce a power consumption of the filter inductor, and improve a thermal resistance between the filter inductor and one or more external components, devices, and/or equipment items.

FIG. 1a depicts an exploded view of an illustrative embodiment of an exemplary filter inductor 100 for high-current applications, in accordance with the present application. The filter inductor 100 includes a magnetic core assembly 102 (see FIG. 1b) and a winding 104. The magnetic core assembly 102 includes a first core portion 102.1 and a second core portion 102.2. The first core portion 102.1 includes a recessed channel 106 configured to receive a shaped winding section (see FIG. 2, reference numeral 202) of the winding 104. The second core portion 102.2 includes a pair of recessed regions 108.1, 108.2 configured to receive a pair of arm sections (see FIG. 2, reference numerals 204.1, 204.2) of the winding 104, respectively. FIG. 1b depicts a perspective view of the filter inductor 100, including the magnetic core assembly 102, the first core portion 102.1, the second core portion 102.2, and the winding 104, in an assembled configuration.

FIG. 2 depicts a perspective view of the winding 104 included in the filter inductor 100 of FIGS. 1a and 1b. As shown in FIG. 2, the winding 104 includes the shaped winding section 202 having opposing ends 210.1, 210.2, a pair of arm sections 204.1, 204.2 extending laterally from the opposing ends 210.1, 210.2 of the shaped winding section 202, respectively, and a pair of inductor pins 206, each inductor pin 206 extending substantially perpendicular from an end (not numbered) of a respective one of the pair of arm sections 204.1, 204.2. For example, the shaped winding section 202 can be a C-shaped section or any other suitably shaped section. Further, the arm section 204.1 can be longer than the arm section 204.2 (as illustrated in FIG. 2), the arm section 204.2 can be longer than the arm section 204.1, or the arm sections 204.1, 204.2 can have substantially the same length. The winding 104 can further include one or more connector pins 208 extending substantially perpendicular from at least one of the arm sections 204.1, 204.2, in a direction opposite to that of the inductor pin 206 extending from the respective arm section 204.1 or 204.2.

In an exemplary mode of fabrication, the winding 104 of the filter inductor 100 including the C-shaped section 202, the pair of arm sections 204.1, 204.2, the pair of inductor pins 206, and the connector pins 208 are formed from a sheet of copper material using any suitable sheet-metal processing technique. Further, the recessed channel 106 is formed in the first core portion 102.1 of the magnetic core assembly 102, and the recessed regions 108.1, 108.2 are formed in the second core portion 102.2 of the magnetic core assembly 102. The C-shaped section 202 of the winding 104 is received in the recessed channel 106 of the first core portion 102.1, and the arm sections 204.1, 204.2 of the winding 104 are received in the recessed regions 108.1, 108.2 of the second core portion 102.2, respectively. The first core portion 102.1 and the second core portion 102.2 are coupled in contact to one another to secure at least the C-shaped section 202 of the winding 104 within the magnetic core assembly 102.

Figure 3:
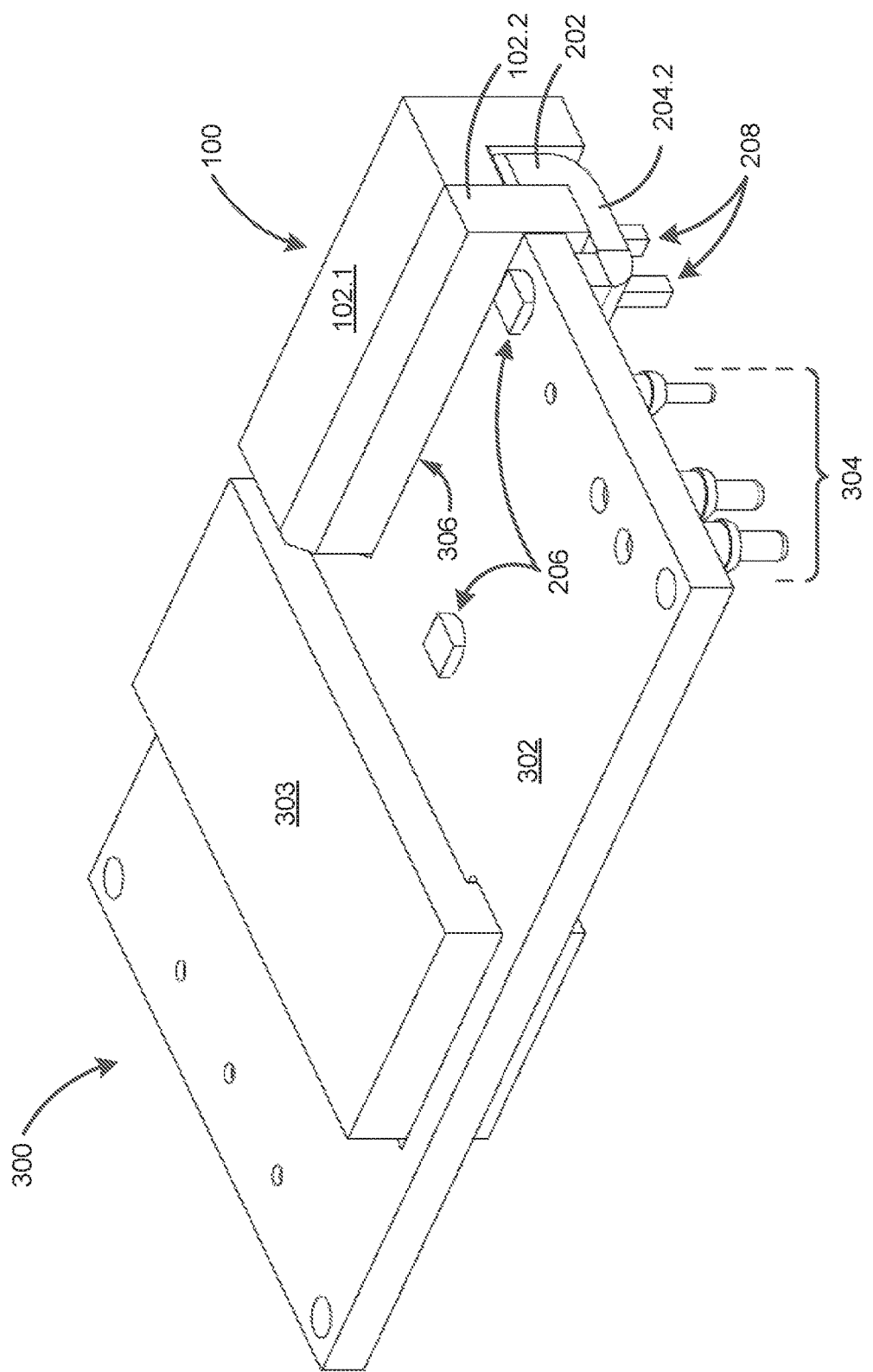
FIG. 3 is a perspective view of an exemplary printed circuit board (PCB) assembly, in which the filter inductor of FIGS. 1a and 1b is mounted along an edge of a PCB.

FIG. 3 depicts a perspective view of an exemplary completed PCB assembly 300 that includes the filter inductor 100 of FIGS. 1a and 1b. As shown in FIG. 3, the PCB assembly 300 further includes a PCB 302, an integrated circuit (IC) component 303 mounted on one side the PCB 302, and a plurality of PCB pins 304 coupled to and extending from an opposite side of the PCB 302. The plurality of PCB pins 304 can provide electrical and/or mechanical connections to the PCB assembly 300. As further shown in FIG. 3, the compact winding-magnetic core configuration of the filter inductor 100 allows it to be mounted along an edge (such as an edge 306; see FIG. 3) of the PCB 302.

In the PCB assembly 300, a pair of holes (not numbered) can be drilled or otherwise formed through the PCB 302 at locations suitable to receive the pair of inductor pins 206 of the filter inductor 100, respectively. Further, a surface of the second core portion 102.2 can be positioned against the edge 306 of the PCB 302 so as to align the inductor pins 206 with the respective drilled holes. The filter inductor 100 can then be slid along the edge 306 to insert the inductor pins 206 through the respective drilled holes until portions of the inductor pins 206 protrude from a surface of the PCB 302, thereby providing points of electrical connection to the winding 104 of the filter inductor 100. In one embodiment, each respective inductor pin 206 can be formed with one or more stops 110 (see FIG. 1b), and the inductor pins 206 can be inserted through the respective drilled holes until the PCB 302 impinges against the stops 110.

Once the inductor pins 206 are inserted through the respective holes in the PCB 302, the inductor pins 206 can be soldered to establish the points of electrical connection to the winding 104 of the filter inductor 100. In the completed PCB assembly 300, the profile of the filter inductor 100 is lowered by about one quarter or more compared to that of a conventional filter inductor. Moreover, the connector pins 208 of the filter inductor 100 provide further mechanical connections to the PCB assembly 300, as well as provide further points of electrical connection to the winding 104 of the filter inductor 100.

Figure 4:
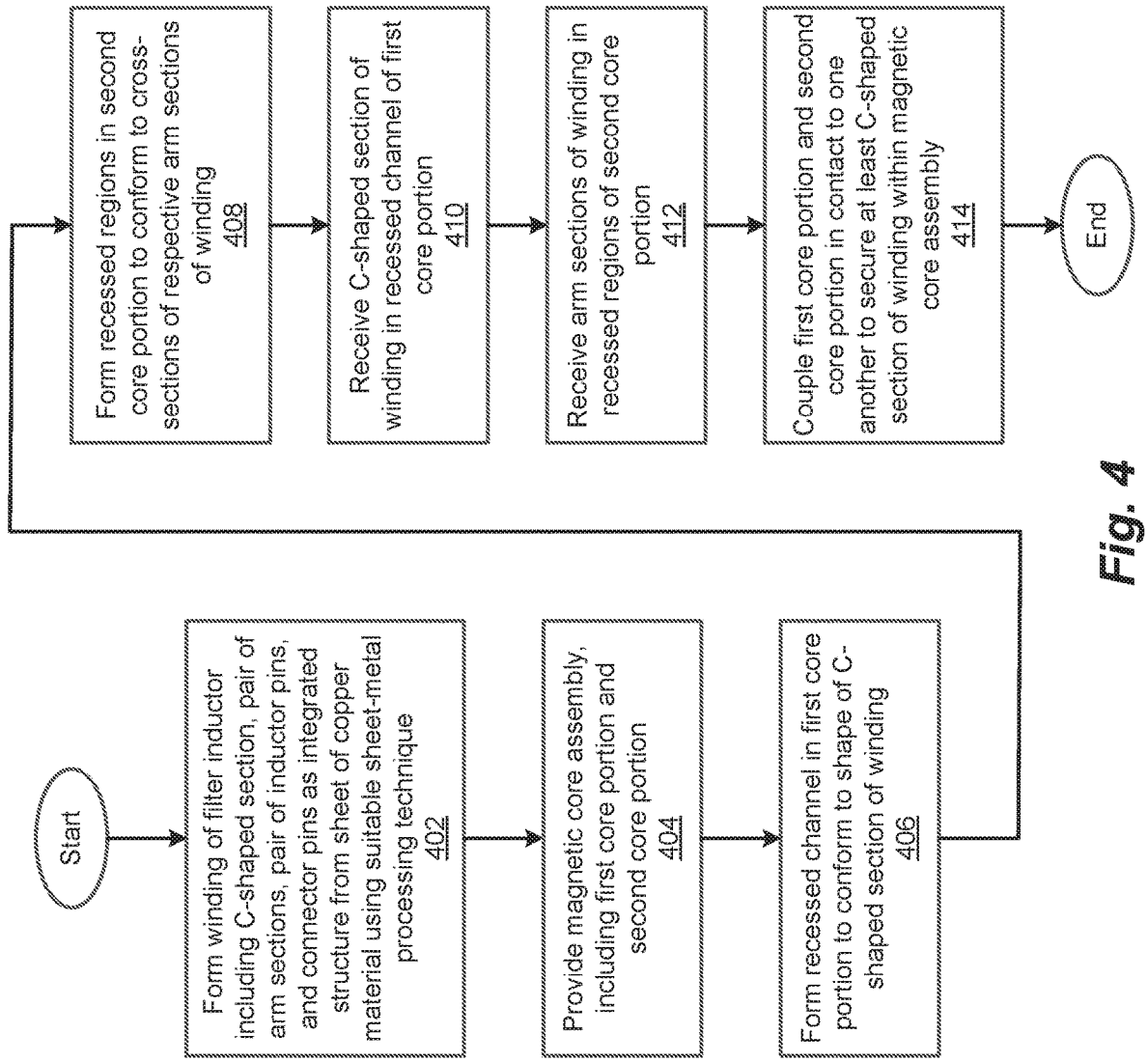
FIG. 4 is a flow diagram of an exemplary method of fabricating the filter inductor of FIGS. 1a and 1b.

An exemplary method of fabricating the filter inductor 100 of FIGS. 1a and 1b is described herein with reference to FIG. 4, as well as FIGS. 1a, 1b, and 2. As depicted in block 402 (see FIG. 4), the winding 104 (see FIGS. 1a and 1b) of the filter inductor 100 including the C-shaped section 202 (see FIG. 2), the pair of arm sections 204.1, 204.2, the pair of inductor pins 206, and the connector pins 208 are formed as an integrated structure from a sheet of copper material using a suitable sheet-metal processing technique. As depicted in block 404, the magnetic core assembly 102 is provided, including the first core portion 102.1 and the second core portion 102.2. As depicted in block 406, the recessed channel 106 is formed in the first core portion 102.1 to conform to a shape of the C-shaped section 202 of the winding 104. As depicted in block 408, the recessed regions 108.1, 108.2 are formed in the second core portion 102.2 to conform to cross-sections of the respective arm sections 204.1, 204.2 of the winding 104. As depicted in block 410, the C-shaped section 202 of the winding 104 is received in the recessed channel 106 of the first core portion 102.1. As depicted in block 412, the arm sections 204.1, 204.2 of the winding 104 are received in the recessed regions 108.1, 108.2 of the second core portion 102.2. As depicted in block 414, the first core portion 102.1 and the second core portion 102.2 are coupled in contact to one another to secure at least the C-shaped section 202 of the winding 104 within the magnetic core assembly 102.

Having described the foregoing illustrative embodiment of the filter inductor 100, other alternative embodiments and/or variations can be made. For example, it was described herein that the profile of the filter inductor 100 in a PCB assembly could be lowered by mounting the filter inductor 100 along an edge of a PCB. In an alternative embodiment, the profile of the filter inductor 100 can be further lowered by reducing a height of the magnetic core assembly 102. In another alternative embodiment, the filter inductor 100 can be mounted along more than one edge of a PCB, such as within a cutout region of the PCB 302 (see FIG. 3). In this way, uniform dimensions in length and/or width of the PCB 302 can be maintained while lowering the profile of the filter inductor 100 within the completed PCB assembly 300. It was further described herein that the disclosed compact winding-magnetic core configuration is implemented in a filter inductor. In an alternative embodiment, one or more features of the disclosed compact winding-magnetic core configuration can be implemented in a power inductor, a transformer, or any other suitable passive magnetic component or device.

While various embodiments of the invention have been particularly shown and described, it will be understood by those skilled in the art that various changes in form and details may be made therein without departing from the scope of the invention as defined by the appended claims.

What is claimed is:

1. A passive magnetic component, comprising:
a magnetic core; and
a winding,
wherein the winding includes (1) a C-shaped section having a first end and a second end, (2) first and second arm sections, the first arm section extending laterally from the first end of the C-shaped section and the second arm section extending laterally from the second end of the C-shaped section, and (3) first and second inductor pins, the first inductor pin extending substantially perpendicular from an end of the first arm section and the second inductor pin extending substantially perpendicular from an end of the second arm section.

2. The passive magnetic component of claim 1 wherein the winding further includes at least one connector pin extending substantially perpendicular from the end of one of the arm sections in a direction opposite the respective inductor pin.

3. The passive magnetic component of claim 1 wherein the magnetic core includes a first core portion having a recessed channel configured to receive at least the C-shaped section of the winding.

4. The passive magnetic component of claim 3 wherein the magnetic core further includes a second core portion having a pair of recessed regions configured to receive the first and second arm sections, respectively.

5. The passive magnetic component of claim 4 wherein the first core portion and the second core portion are coupled in contact to one another to secure at least the C-shaped section of the winding within the magnetic core.

6. The passive magnetic component of claim 1 wherein the first and second arm sections have substantially the same length.

7. The passive magnetic component of claim 1 wherein the winding including the C-shaped section, the first and second arm sections, and the first and second inductor pins are formed from a sheet of metal.

8. The passive magnetic component of claim 7 wherein the sheet of metal is a sheet of copper material.

9. The passive magnetic component of claim 1 wherein at least one of the connector pins has at least one stop for limiting an insertion of the at least one connector pin through a hole in a printed circuit board.

10. A method of fabricating a passive magnetic component, comprising:
forming a winding as an integrated structure, the winding including (1) a C-shaped section having a first end and a second end, (2) first and second arm sections, the first arm section extending laterally from the first end of the C-shaped section and the second arm section extending laterally from the second end of the C-shaped section, and (3) first and second inductor pins, the first inductor pin extending substantially perpendicular from an end of the first arm section and the second inductor pin extending substantially perpendicular from an end of the second arm section;
providing a magnetic core assembly including a first core portion and a second core portion;
forming a recessed channel in the first core portion to conform to a C-shape of the C-shaped section of the winding;
receiving the C-shaped section of the winding in the recessed channel of the first core portion; and
coupling the first core portion and the second core portion in contact to one another to secure at least the C-shaped section of the winding within the magnetic core assembly.

11. The method of claim 10 further comprising:
forming a pair of recessed regions in the second core portion to conform to cross-sections of the first and second arm sections of the winding, respectively.

12. The method of claim 11 further comprising:
receiving the first and second arm sections in the pair of recessed regions of the second core portion, respectively.

13. The method of claim 10 wherein the forming of the winding as the integrated structure includes forming the winding from a sheet of metal.

14. A printed circuit board assembly, comprising:
a printed circuit board having an edge; and
a passive magnetic component configured to be mounted along the edge of the printed circuit board, wherein the passive magnetic component incudes:
a magnetic core; and
a winding,
wherein the winding includes (1) a C-shaped section having a first end and a second end, (2) first and second arm sections, the first arm section extending laterally from the first end of the C-shaped section and the second arm section extending laterally from the second end of the C-shaped section, and (3) first and second inductor pins, the first inductor pin extending substantially perpendicular from an end of the first arm section and the second inductor pin extending substantially perpendicular from an end of the second arm section.

15. The printed circuit board assembly of claim 14 wherein the winding further includes at least one connector pin extending substantially perpendicular from the end of one of the arm sections in a direction opposite the respective inductor pin.

16. The printed circuit board assembly of claim 14 wherein the printed circuit board includes a plurality of holes formed therethrough, and wherein the first and second inductor pins of the winding are inserted through the plurality of holes in the printed circuit board, respectively.

17. The printed circuit board assembly of claim 16 wherein the magnetic core includes a first core portion having a recessed channel configured to receive at least the C-shaped section of the winding, and a second core portion having a pair of recessed regions configured to receive the first and second arm sections of the winding, respectively.

18. The printed circuit board assembly of claim 17 wherein the first core portion and the second core portion are coupled in contact to one another to secure at least the C-shaped section of the winding within the magnetic core, and wherein a surface of the second core portion is positioned against the edge of the printed circuit board so as to align the first and second inductor pins of the winding with the plurality of holes in the printed circuit board, respectively.

\* \* \* \* \*